(12) United States Patent
Nakahara

(10) Patent No.: US 7,002,179 B2
(45) Date of Patent: Feb. 21, 2006

(54) ZNO SYSTEM SEMICONDUCTOR DEVICE

(75) Inventor: Ken Nakahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 87 days.

(21) Appl. No.: 10/772,077

(22) Filed: Feb. 4, 2004

(65) Prior Publication Data

US 2004/0227150 A1    Nov. 18, 2004

(30) Foreign Application Priority Data

Mar. 14, 2003    (JP) .............................. 2003-071023

(51) Int. Cl.
*H01L 29/15* (2006.01)
(52) U.S. Cl. ....................................................... 257/76
(58) Field of Classification Search ................. 257/76, 257/768; 359/321
See application file for complete search history.

(56) References Cited

U.S. PATENT DOCUMENTS

2004/0108505 A1 *   6/2004   Tuller et al. ................... 257/76
2004/0207903 A1 *  10/2004   Apostolopoulos et al. .. 359/321

FOREIGN PATENT DOCUMENTS

JP          2002-118330         4/2002

OTHER PUBLICATIONS

Soon-Ku Hong et al., "Control of polarity of ZnO films grown by plasma-assisted molecular-beam epitaxy: Zn- and O-polar ZnO films on Ga-polar GaN templates", Applied Physics Letters, vol. 77, No. 22, Nov. 27, 2000, pp. 3571-3573.
D.C. Look et al., "Characterization of homoepitaxial p-type ZnO grown by molecular beam epitaxy", Applied Physics Letters, vol. 81, No. 10, Sep. 2, 2002, pp. 1830-1832.

* cited by examiner

Primary Examiner—Roy Potter
(74) Attorney, Agent, or Firm—Hogan & Hartson, LLP

(57) ABSTRACT

In order to provide ZnO system semiconductor devices having a stable p-type ZnO layer, a ZnO thin film is doped with nitrogen atoms having a high concentration. By fabricating the stable p-type ZnO layer, combinations with n-type ZnO layers easy of fabrication, or combinations with different compositions of p-type layers or n-type layers are made possible, thereby it enables to provide various configurations of ZnO system semiconductor devices.

A ZnO system semiconductor device according to the present invention is characterized in that in a semiconductor device comprising one or more layers of n-type layer and p-type layers respectively, at least one layer of said p-type layers is (are) formed of the Zn-polar ZnO system semiconductor film doped with nitrogen atoms such that the thin film growth direction of said Zn-polar ZnO system semiconductor film is conformed to the direction of Zn polarity (0001).

4 Claims, 6 Drawing Sheets

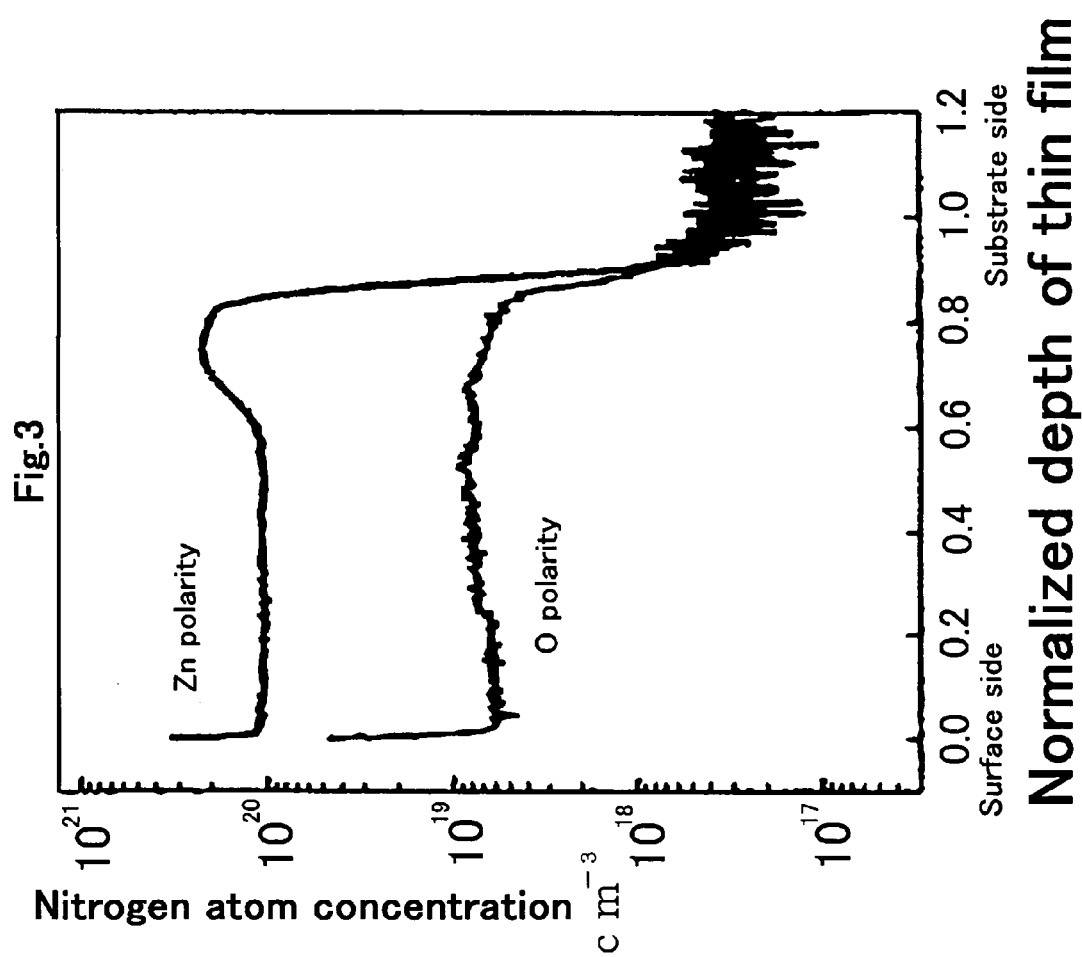

ZNO SYSTEM SEMICONDUCTOR DEVICE

BACKGROUND OF THE INVENTION

1. Field of the Invention

The present invention relates to a ZnO system semiconductor device comprising a p-type layer formed of a p-type ZnO thin film, doped with nitrogen atoms as a p-type layer of a PN junction in a semiconductor device, such that the thin film growth direction is conformed to the direction of Zn polarity (0001).

2. Description of the Related Art

A ZnO (zinc oxide) thin film is optically transparent and has a piezo-electric property and characteristics of a n-type semiconductor, and is also useful as materials, for example, such as those for a surface-acoustic-wave (SAW) device and a transparent thin film transistor (TPT). Among those, many devices have already been put to practical use in the form of polycrystal, such as a surface acoustic wave device, a gas sensor, a piezoelectric device, and a pyroelectric device.

Moreover, the ZnO thin film is expected to become applicable to photoelectron devices as well, in addition to these applications. To be more specific, ZnO constitutes a direct transit semiconductor wherein the wave number of the minimum value of the conduction band is equal to the wave number of the maximum of the valence band, with a large forbidden-band width (energy gap is about 3.4 eV), so that the ZnO has been expected as a materials for photoelectron devices applicable to a band ranging from the blue to ultra-violet. Even as compared with GaN system compound covering almost the same wavelength band, excited electrons and holes have the same wave number, and easily emit light by recombination without being accompanying by any change in kinetic momentum for the recombination, resulting in its remarkably high exciton binding energy (60 meV for ZnO, and 24 meV for GaN). Accordingly, ZnO has attracted attention since photons excellent in monochromaticity can be released by utilizing a highly efficient exciton luminescence process.

Thus, there are expected also applications as light emitting-and light receiving devices in the blue and ultra-violet band by utilizing its characteristic of wide band gap semiconductors. On the other hand, there are known in case of the ZnO thin film crystal, defects and etc. due to oxygen holes and interstitial zinc atoms. On occurrence of such crystal defects, electrons not contributing to atomic bonding are generated and thus ZnO film exhibits a n-type conductivity. In order to carry out conduction-type control by impurities, reduction of these defects is essentially important whereby p-type doping becomes possible by reducing the concentration of such residual electrons.

However, since difficulties are caused by the growth of high quality thin film material as well as the reduction of the concentration of residual electrons probably due to the oxygen holes, p-type has been difficult to fabricate.

Under such a situation, there has been made an invention for the purpose of obtaining a semiconductor light emitting device for a wide range of light from green to ultra violet, employing ZnO system materials of hexagonal system so as to take into account environmental circumstances (refer to patent 1 in related art document below), but there has been few disclosures about p-type ZnO material serviceable in practical use, with the result that there has been posed a problem involved in the development of ZnO system semiconductor devices causing no degradation in luminous efficiency.

In terms of the fabrication of p-type ZnO thin films, there is a report that p-type ZnO thin films, with nitrogen atoms doped, have been formed by using a Zn-polar ZnO bulk substrate (refer to non-patent document 1 in related art document below).

Moreover, since there is required a film formation method of high quality ZnO single crystal thin films, enabling to prevent the generation of crystal defects, controlling the polarity of ZnO is under investigation. Recently, there is a report that it is possible to control the film formation direction of a ZnO thin film so as to achieve O polarity or Zn polarity, in such a manner as to grow ZnO on a Ga-polar GaN substrate, with a polarity controlled (refer to non-patent document 2 in related art document below).

RELATED ART DOCUMENT

[Patent Document 1]
Japanese laid-open patent publication, JP, 2002-118330, A, especially paragraph (0041)

[Non-Patent Document 1]
APPLIED PHYSICS LETTERS Volume81, Number10, 2 Sep. 2002 p.1830–1832

[Non-Patent Document 2]
APPLIED PHYSICS LETTERS Volume77, Number22, 27 Nov. 2000 p.3571–3573

SUMMARY OF THE INVENTION

It is difficult to form a p-type ZnO thin film as mentioned above, and there are also few reports. In view of the fact that in case of nitrogen-doped ZnO thin film, any p-type can not be achieved on the condition of a small quantity of doped nitrogen atoms, the inventor has discovered that in order to fabricate a stable p-type, it is necessary to obtain a ZnO layer doped with increased quantity of nitrogen atoms, and furthermore, that there is a correlation between the polarity of ZnO thin films and the quantity of doped nitrogen atoms, with the result that the present invention has been completed. On the assumption that it becomes possible to fabricate stable p-type ZnO layers, combinations with n-type ZnO layers easy of fabrication, or combinations with p-type layers or N-type layers of different compositions, are made possible, thereby it enables to fabricate various forms of ZnO system semiconductor devices. The object of the present invention is to provide a ZnO system semiconductor device having such a stable p-type ZnO layer.

In order to solve the above-mentioned problem, this invention has been made by taking notice of a correlation between the polarity of ZnO thin films and a quantity of doped nitrogen atoms. That is to say, according to the present invention there is provided a ZnO system semiconductor device comprising one or more layers of n-type layer and p-type layer, respectively, characterized in that at least one layer of said p-type layers is (are) formed by a Zn-polar ZnO system semiconductor film doped with nitrogen atoms, such that the thin film growth direction of said Zn-polar ZnO system semiconductor film is conformed to the direction of Zn polarity (0001). Here, it is preferable that a underlying layer at the time of formation of said Zn-polar ZnO system semiconductor thin film is constituted of a Ga-polar GaN system thin film, a Zn-polar ZnO substrate or Zn-polar MgZnO thin film. Furthermore, nitrogen atom concentration of said Zn-polar ZnO system semiconductor thin film is preferably $1 \times 10^{20}$ cm$^{-3}$ or more.

BRIEF DESCRIPTION OF THE DRAWINGS

FIG. 3 is a view showing a relationship of the doping amount of nitrogen atom to the depth direction of the ZnO thin film with respect to a nitrogen atom doped Zn-polar ZnO thin film and a nitrogen atom doped O-polar ZnO thin film.

DETAILED DESCRIPTION OF THE INVENTION

Hereinafter, the present invention will be described in detail with reference to embodiments, but the present invention shall not be interpreted as being limited to these descriptions.

DESCRIPTION OF THE PREFERRED EMBODIMENTS (Fabrication of Nitrogen Atom Doped Zn-polar ZnO Thin Film)

There serves as a substrate a C-plane (0001) sapphire substrate, on which undoped GaN (44 $\mu$m) film is formed. At this time, a GaN thin film was produced as a Ga-polar (0001) GaN epitaxial growth film. This undoped GaN thin film was formed by using material gas of well-known public use with MOCVD (metal organic chemical deposition) method. For example, trimethyl gallium is employed for a gallium source, while ammonia is employed for a nitrogen source, and nitrogen gas and hydrogen gas is employed for carrier gas.

Next, the ZnO thin film was deposited under polarity control by using the method described in the non-patent document 2. Namely, after HCL processing of the GaN substrate having been carried out, Ga polarity (0001) plane was irradiated, before growth process, with a metal Zn, before a ZnO thin film is formed inside a film formation chamber. The condition here was set at 700° C. for 3 minutes.

Under the condition of being kept irradiated with a metal Zn at a deposition temperature of 400–650° C. for example, 500° C. and in the ultimate vacuum of $1.33 \times 10^{-7}$ Pa ($1 \times 10^{-9}$ torr), the film was formed by producing RF O-plasma and RF N-plasma with metal Zn employed as Zn source, with a RS-MBE (Radical Source Molecular Beam Epitaxy) method. Accordingly, there was formed a nitrogen atom doped Zn-polar ZnO thin film. Its resultant thickness was 500 nm. Nitrogen atoms were doped by introducing RF nitrogen plasma.

(Fabrication of Nitrogen Atom Doped O-Polar ZnO Thin Film)

There was used the same substrate as the one used for forming the nitrogen atom doped Zn-polar ZnO thin film. Next, before a ZnO thin film being formed, RF O-plasma irradiation processing to Ga polarity (0001) plane was carried out. The condition at this time was set at 700° C. for 15 seconds.

After RF O-plasma processing having been carried out, the film was formed by producing RF O-plasma and RF N—plasma with metal Zn employed as Zn source, with RS-MBE (Radical Source Molecular Beam Epitaxy) method, under the condition of the deposition temperature set, for example, 500° C. and in the ultimate vacuum of $1.33 \times 10^{-7}$ Pa ($1 \times 10^{-9}$ torr). Accordingly a nitrogen atom doped O-polar ZnO thin film was formed. Its resultant thickness was 500 nm. Also in the O-polar ZnO thin film, nitrogen atoms were doped by means of an introduced RF nitrogen plasma.

Although the nitrogen atom doped Zn-polar, or O-polar ZnO thin film has been described, as an example, as an exemplary case of ZnO thin film, ZnO system semiconductor thin films may be applicable. ZnO system semiconductors refer to ZnO, ZnCdO, ZnMgO, ZnCdMgO, ZnOSe, ZnOS and etc., and combinations thereof.

Figure 1:
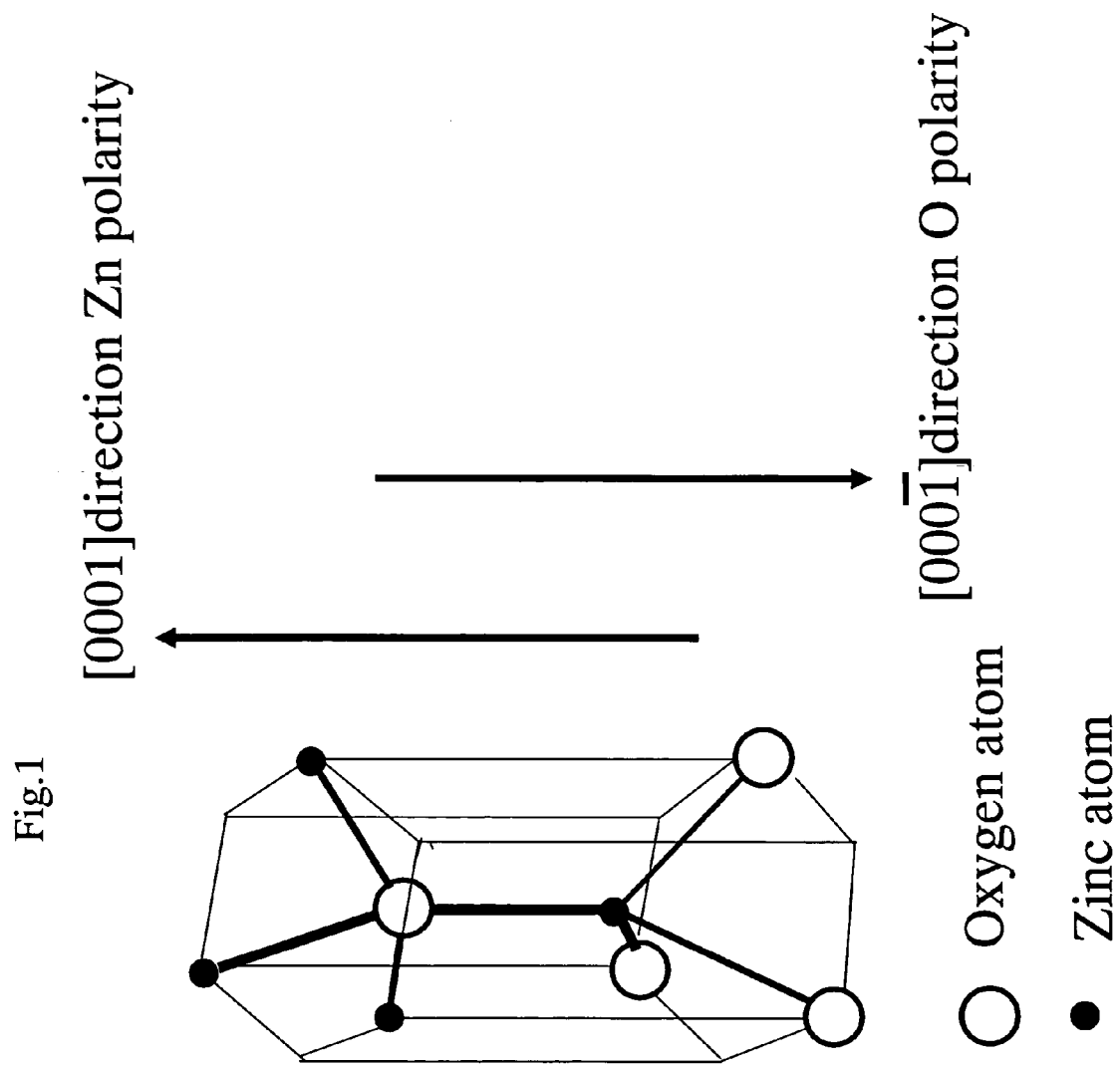
FIG. 1 is a view for explaining the direction of Zn polarity and the direction of O polarity to the crystal structure of ZnO.

In FIG. 1, there are shown the direction of Zn polarity and the direction of O polarity in a ZnO crystal structure. A fundamental unit of the structure of ZnO has a shape as shown in FIG. 1, and the direction is the Zn polarity (0001).

Figure 2:
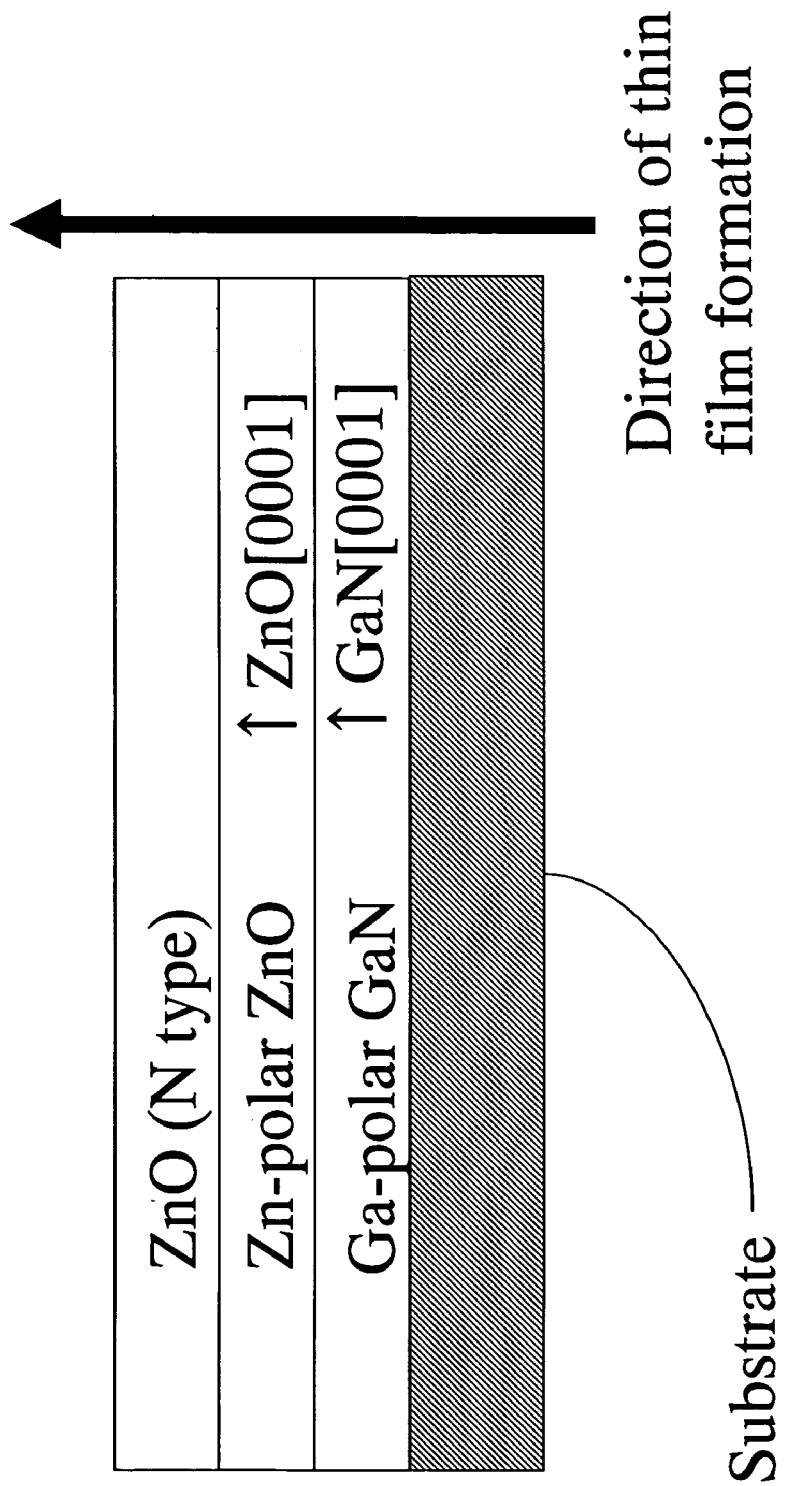
FIG. 2 is a view showing a positional relationship between a Zn-polar ZnO thin film layer of a ZnO system semiconductor device and a substrate according to the present invention.

The ZnO system semiconductor device according to the present invention is a semiconductor device which has one or more layers of n-type layer and p-type layer, respectively, wherein at least one layer of the p-type layers is (are) formed of a Zn-polar ZnO system semiconductor film, which is doped with nitrogen atoms. Furthermore, this Zn-polar ZnO system semiconductor thin film is formed in such a manner that its thin film growth direction conforms to the direction of Zn polarity (0001). Namely, the semiconductor device is formed on a substrate by laminating a p-type layer or a n-type layer such that the direction of Zn polarity (0001) of the ZnO system semiconductor thin films may be conformed to the laminating direction at the time of forming each layer on the substrate, as shown in FIG. 2. The ZnO system semiconductor device of the present invention is a semiconductor device formed by laminating the ZnO system semiconductor thin films on a substrate, wherein each ZnO system semiconductor thin film is constituted such that each direction from the substrate toward the laminating structure is conformed to the directions of Zn polarity.

In particular, an underlying layer employed at the time of formation of the Zn-polar ZnO system semiconductor thin film may be demonstrated in exemplary form of a Ga-polar GaN system thin film, a Zn-polar ZnO substrate or Zn-polar MgZnO thin film. In the case of a Ga-polar GaN system thin film, there may be carried out Zn processing before a nitrogen atom doped ZnO thin film being formed on the Ga-polar GaN system, but a bonding is to be performed between Ga-polar GaN layer and Zn-polar ZnO without forming any interface layer therebetween.

The polarity was evaluated by means of hydrochloric-acid etching. Zn-polar ZnO thin films are hardly dissolved when processed using the mixed hydrochloric acid made up of a mixture with a ratio of water 5 to hydrochloric acid 100 at room temperature for 10 seconds, whereas O-polar ZnO thin films are dissolved. Accordingly, the polarity was evaluated based on the dissolution speed. There is assumed to be involved an easiness of ion exchange depending on the composition of the uppermost surface and etc.

In terms of nitrogen atom doped Zn-polar ZnO thin films and nitrogen atom doped O-polar ZnO thin films produced in such a manner, there was examined a relationship of the quantity of doped nitrogen atoms with respect to the depth direction of the ZnO thin film by means of SIMS (secondary ion mass spectrometry). The result is shown in FIG. 3. As shown in FIG. 3, the resultant amount of nitrogen atoms taken into ZnO was about $1 \times 10^{20}$ cm$^{-3}$ in case of Zn polarity, and on the other hand, was about $6 \times 10^{18}$ cm$^{-3}$ in case of O polarity. It has been appreciated that despite the same condition employed the Zn-polar ZnO thin film can be doped with more nitrogen atoms one or more orders of magnitude as compared with O-polar ZnO thin film. Such being the case, although it is not certain, why many nitrogen atoms are taken in case of formation of a Zn-polar ZnO thin film, the inventor assumes that the surface state at the time of deposition has a catalytic action in taking in nitrogen.

Because a nitrogen doped ZnO thin film has high concentration of electrons in a remaining quantity, generally, a doped amount of nitrogen on the order of $1 \times 10^{18}$ cm$^{-3}$ can not lead to any formation of a p-type semiconductor. However, the nitrogen atom doped Zn-polar ZnO thin film constituting a ZnO system semiconductor device according to the present invention give rise to a stable p-type semiconductor, since nitrogen atoms could be doped with high concentration.

Studies on III–V family semiconductors (GaN) and etc. has been actively made for some time, in an effort to achieve luminescence and laser oscillation of the blue and near-ultraviolet band, at present, the oxide semiconductor ZnO belonging to II–VI family is attracting strong attention as a next-generation material of light emitting devices. At present, there have been identified following two kinds of luminescence originating in ZnO. Namely, (1) luminescence over the wavelength band ranging from the green to yellow wavelength: luminescence under the condition of oxygen vacant state (state represented by the relationship; the number of Zn atom>the number of O atom, within ZnO), and (2) luminescence originating in near-ultraviolet-ray wavelength band: luminescence resulting from excitons of ZnO. In order to obtain luminescence of the near-ultraviolet-ray wavelength band near 385 nm, an epitaxial growth single crystal thin film is required as in the case of the above-mentioned nitrogen atom heavily-doped Zn-polar ZnO thin film constituting a ZnO system semiconductor device of the present invention, and furthermore there are also required high quality thin films with conformed polarity as well as good crystallinity.

Figure 4B:
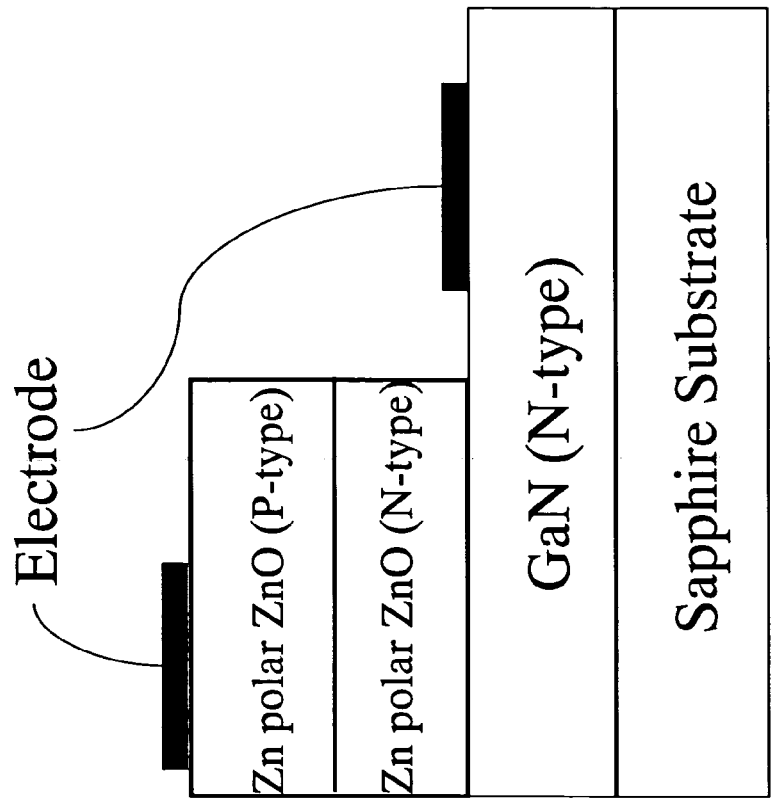
FIG. 4 is a view showing one embodiment of a ZnO system semiconductor device with a nitrogen atom heavily-doped Zn-polar ZnO thin film as a p-type layer, but in the case of a homo-junction. Two examples are shown in FIG. 4.
Figure 4A:
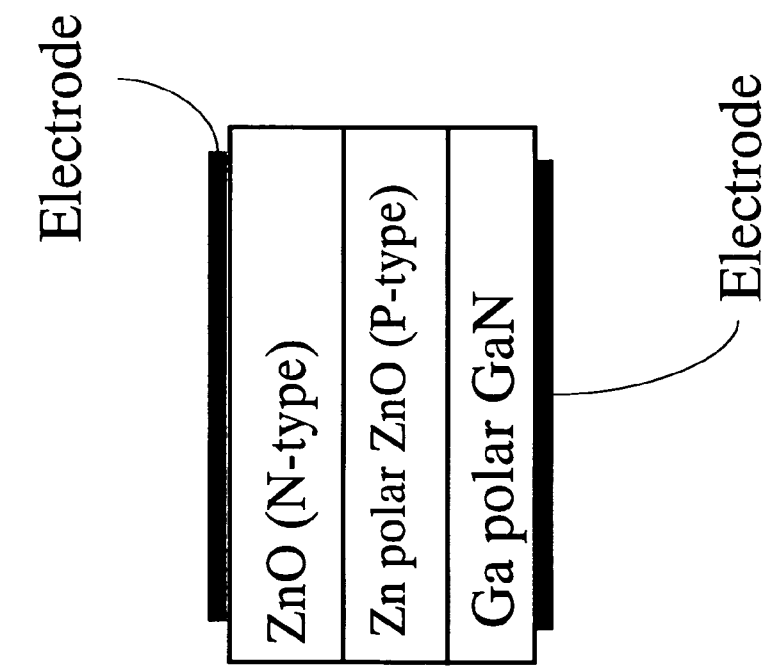
Figure 5B:
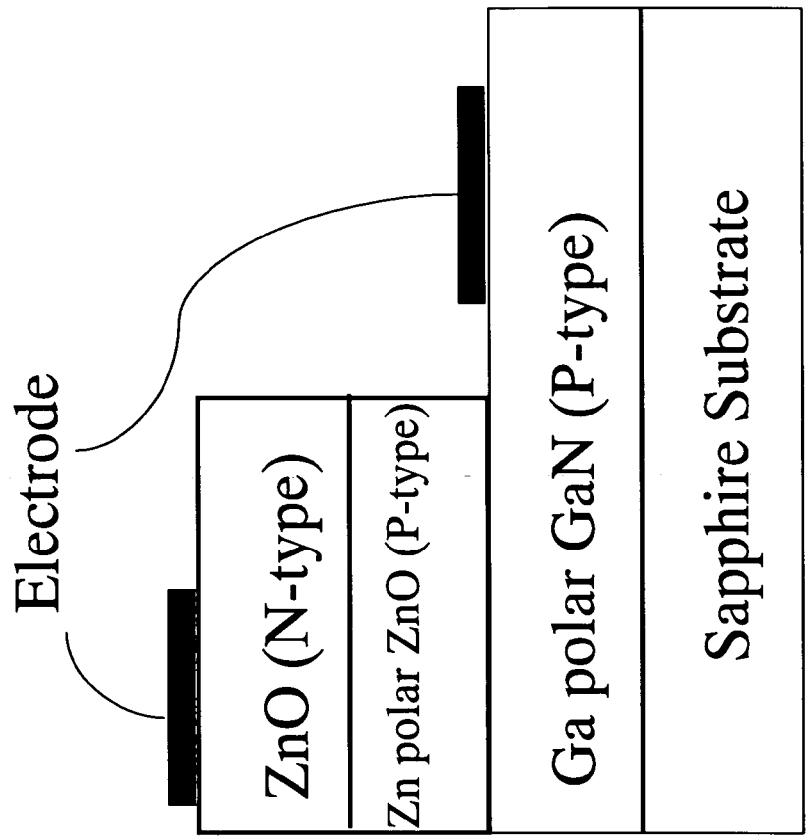
FIG. 5 is a view showing one embodiment of a ZnO system semiconductor device with a nitrogen atom heavily-doped Zn-polar ZnO thin film as a p-type layer, but in the case of a single hetero-junction. Two examples are shown in FIG. 5.
Figure 5A:
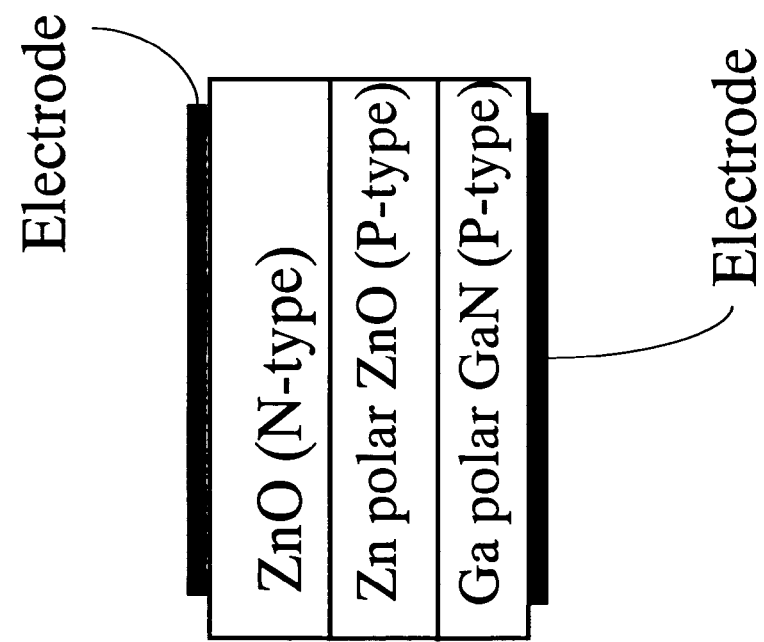
Figure 6B:
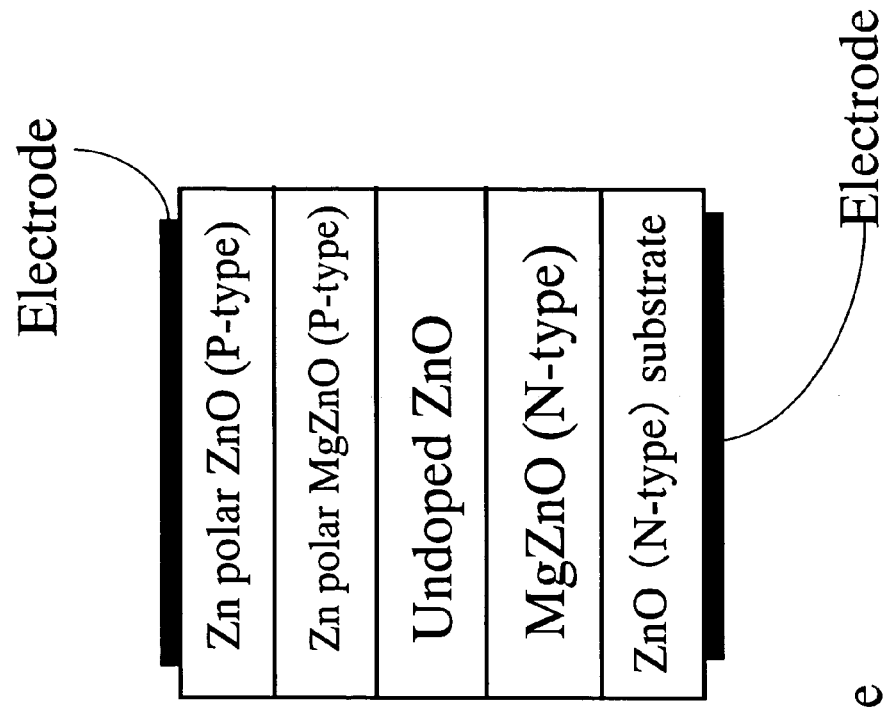
FIG. 6 is a view showing one embodiment of a ZnO system semiconductor device with a nitrogen atom heavily-doped Zn-polar ZnO thin film as a p-type layer, wherein the case of a double hetero-junction is shown. Two examples are shown in FIG. 6.
Figure 6A:
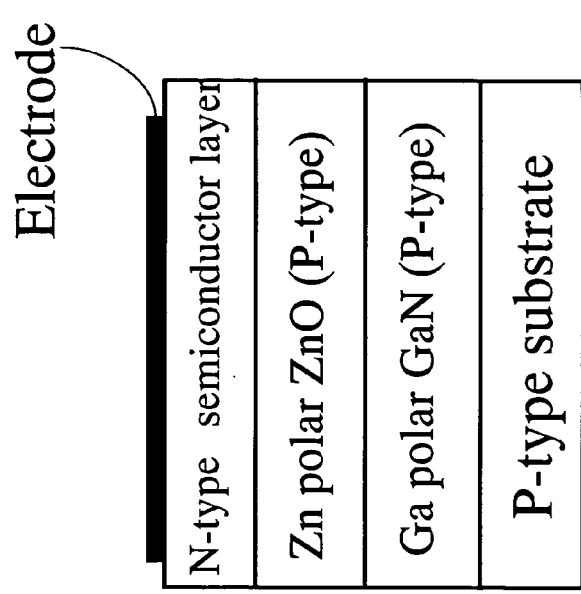

Embodiments shown in FIGS. 4–6 can be demonstrated in the form of a ZnO system semiconductor device, whose nitrogen atom heavily-doped Zn-polar ZnO thin film serves as a p-type layer. FIG. 4 shows an embodiment in the case of a homo-junction, FIG. 5 shows an embodiment in the case of a single hetero-junction (SH), FIG. 6 shows a embodiment in the case of a double hereto-junction (DH).

Examples for materials of ZnO(N-type) shown these views may be enumerated as follows; hexagonal ZnO, Zn(OS), Zn(OSe), Zn(OTe), Zn(OSSe), Zn(OSeTe), Zn(OSTe), and etc. Moreover, non-doped ZnO exhibits n-type conductivity due to the existence of oxygen holes. Furthermore, the conductivity of n-type can be controlled by doping B, Al, Ga, In, Si, and F as a donor.

[Effect of the Invention]

According to the present invention, by utilizing a certain correlation between the polarity of a ZnO thin film and the quantity of doped nitrogen atoms, i.e. by utilizing a relationship that the ZnO thin film formed so as to have Zn polarity in atmosphere containing a nitrogen source, exhibits high concentration of doped nitrogen atoms, there has successfully come to be able to realize the formation of a stable p-type ZnO system semiconductor layer. Since all of uniform polarity is made in the form of the Zn polarity in terms of the laminating direction of the substrate, the crystal is of high quality and degradation of luminous efficiency thereof is small. Accordingly, if stable p-type ZnO layers can be fabricated, combinations with n-type ZnO layers easy of fabrication, or combinations with different compositions of p-type layers or n-type layers can be made, thereby it enables to fabricate various configurations of ZnO system semiconductor devices. According to the present invention, it is made possible to provide ZnO system semiconductor devices having such a stable p-type ZnO layer.

What is claimed is:

1. A ZnO system semiconductor device comprising one or more layers of n-type layer and p-type layer respectively, characterized in that at least one layer of said p-type layers is (are) formed of a Zn-polar ZnO system semiconductor film doped with nitrogen atoms, such that the thin film growth direction of said Zn-polar ZnO system semiconductor film is conformed to the direction of Zn polarity (0001), and the underlying layer at the time of formation of said Zn-polar ZnO system semiconductor thin film is Zn-polar MgZnO or Ga-polar GaN thin film.

2. A ZnO system semiconductor device comprising one or more layers of n-type layer and p-type layer respectively, characterized in that at least one layer of said p-type is (are) formed of a Zn-polar ZnO system semiconductor film doped with nitrogen atoms, such that the thin film growth direction of said Zn-polar ZnO system semiconductor film is conformed to the direction of Zn polarity (0001), and a composition of said Zn-polar ZnO system semiconductor film is ZnCdO, ZnMgO, ZnCdMgO, ZnOSe, or ZnOS.

3. A ZnO system semiconductor device comprising one or more layers of n-type layer and p-type layer respectively, characterized in that at least one layer of said p-type layers is (are) formed of a Zn-polar ZnO system semiconductor film doped with nitrogen atoms, such that the thin film growth direction of said Zn-polar ZnO system semiconductor film is conformed to the direction of Zn polarity (0001), and a composition of said n-tvne layer is Zn(OS), Zn(OSe), Zn(OTe), Zn(OSSe), Zn(OSeTe) or Zn(OSTe).

4. The ZnO system semiconductor device according to claim 1, 2, or 3 characterized in that nitrogen atom concentration of said Zn-polar ZnO system semiconductor thin film is $1 \times 10^{20}$ cm$^{-3}$ or more.

* * * * *